United States Patent
Sumiyoshi (10) Patent No.: US 10,832,905 B2
(45) Date of Patent: Nov. 10, 2020

(54) PROCESS OF FORMING SILICON NITRIDE (SIN) FILM AND SEMICONDUCTOR DEVICE PROVIDING SIN FILM

(71) Applicant: SUMITOMO ELECTRIC INDUSTRIES, LTD., Osaka (JP)

(72) Inventor: Kazuhide Sumiyoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/210,773

(22) Filed: Dec. 5, 2018

(65) Prior Publication Data

US 2019/0172706 A1 Jun. 6, 2019

(30) Foreign Application Priority Data

Dec. 6, 2017 (JP) .................................. 2017-234266

(51) Int. Cl.
*H01L 21/02* (2006.01)
*H01L 29/66* (2006.01)

(52) U.S. Cl.
CPC .... *H01L 21/02271* (2013.01); *H01L 21/0217* (2013.01); *H01L 21/02211* (2013.01); *H01L 29/66462* (2013.01)

(58) Field of Classification Search
CPC ...................... H01L 21/02271; H01L 21/0217
See application file for complete search history.

(56) References Cited

U.S. PATENT DOCUMENTS

| | | |
|---|---|---|
| 127,828 A1 | 9/2002 | Suzuki et al. |
| 6,573,178 B1 | 6/2003 | Nakamura |
| 213,539 A1 | 9/2006 | Hasebe et al. |
| 7,494,943 B2 | 2/2009 | Noro et al. |
| 110,824 A1 | 4/2009 | Takenaga et al. |
| 7,615,163 B2 | 11/2009 | Tamura et al. |
| 9,920,424 B2 | 3/2018 | Goto et al. |
| 2002/0024118 A1 | 2/2002 | Okoshi et al. |
| 2004/0014330 A1 | 1/2004 | Ku et al. |
| 2005/0245099 A1 | 11/2005 | Endo et al. |

(Continued)

FOREIGN PATENT DOCUMENTS

| JP | 2007-227449 | 9/2007 |
|---|---|---|
| JP | 2007227449 A | 9/2007 |

(Continued)

OTHER PUBLICATIONS

U.S. Appl. No. 16/146,906, filed Sep. 28, 2018, Sumiyoshi.
(Continued)

*Primary Examiner* — Changhyun Yi
(74) *Attorney, Agent, or Firm* — Smith, Gambrell & Russell, LLP.

(57) ABSTRACT

A low pressure chemical vapor deposition (LPCVD) technique for nitride semiconductor materials includes steps of: setting a temperature in a furnace to be 750 to 900° C.; substituting an atmosphere in the furnace to ammonia ($NH_3$); depositing a SiN film at an initial pressure by supplying di-chloro-silane ($SiH_2Cl_2$); and subsequently depositing the SiN film at a deposition pressure that is higher than the initial pressure. The invention has a feature that the initial pressure is at least higher than 60% of the deposition pressure.

16 Claims, 12 Drawing Sheets

(56) References Cited

U.S. PATENT DOCUMENTS

| | | |
|---|---|---|
| 2006/0141782 A1 | 6/2006 | Hasebe et al. |
| 2008/0003362 A1 | 1/2008 | Nodera et al. |
| 2008/0282973 A1 | 11/2008 | Okada et al. |
| 2010/0167541 A1 | 7/2010 | Kato |
| 2013/0083568 A1 | 4/2013 | Makiyama et al. |
| 2013/0149874 A1* | 6/2013 | Hirose .............. H01L 21/02271 438/763 |
| 2013/0153923 A1 | 6/2013 | Decoutere |
| 2014/0235067 A1* | 8/2014 | Shimamoto ............. C23C 16/36 438/763 |
| 2015/0235834 A1* | 8/2015 | Han ...................... C23C 16/345 438/791 |
| 2018/0175150 A1* | 6/2018 | Mauder ............. H01L 21/28185 |

FOREIGN PATENT DOCUMENTS

| | | |
|---|---|---|
| JP | 2013-77621 | 4/2013 |
| JP | 2013-123047 | 6/2013 |

OTHER PUBLICATIONS

Chen, Kevin J. et al., "GaN-on-Si Power Technology: Devices and Applications", *IEEE Transactions on Electron Devices*, vol. 64, No. 3, p. 779-p. 795, Mar. 2017.

* cited by examiner

PROCESS OF FORMING SILICON NITRIDE (SIN) FILM AND SEMICONDUCTOR DEVICE PROVIDING SIN FILM

CROSS REFERENCE TO RELATED APPLICATIONS

The present application is based on and claims benefit of a prior Japanese Patent Application No. 2017-234266 filed on Dec. 6, 2017, the entire contents of which are incorporated herein by reference. The present application is also related to the following commonly-assigned U.S. patent application: U.S. Ser. No. 16/146,906, the entire contents of which are incorporated herein by reference.

BACKGROUND OF INVENTION

1. Field of Invention

The present invention relates to a process of forming a silicon nitride (SiN) film and a process of forming a semiconductor device providing the SiN film.

2. Related Prior Arts

A Japanese Patent Application laid open No. JP2007-227449A has disclosed a field effect transistor type of high electron mobility transistor (HEMT) primarily made of nitride semiconductor materials, and a process of forming the HEMT. The process disclosed therein has a sequence of: (a) loading a substrate within an apparatus of Metal Organic Chemical Vapor Deposition (MOCVD); (b) raising a temperature in the apparatus to 1000° C. spending 20 minutes; (c) holding the substrate at the temperature to clean a surface of the substrate; (d) raising the temperature to 1100° C. spending 3 minutes; (e) growing a buffer layer of aluminum nitride (AlN); (f) falling the temperature down to 1070° C. spending 5 minutes; (g) sequentially growing a channel layer of gallium nitride (GaN) and a barrier layer of aluminum gallium nitride (AlGaN); (h) falling the temperature down to 700° C.; and (i) depositing an insulating film of silicon nitride (SiN) by chemical vapor deposition (CVD) technique.

An electronic device primarily made of GaN and materials grouped in GaN has become popular in a filed. Such a device inevitably provides an insulating film to protect a surface of a semiconductor layer chemically and mechanically, where the insulating film is generally made of silicon nitride (SiN) formed at relatively low temperature to prevent nitrogen (N) from dissociating from a surface of the semiconductor layer. A plasma-assisted chemical vapor deposition (p-CVD), another CVD technique using plasma generated by electron cyclotron resonance (ECR-CVD), and so on are a typical technique to deposit a SiN film especially in the field of the compound semiconductor process. As a result, the surface of the semiconductor layer is inevitably exposed in plasma, which induces damages in the surface.

A semiconductor process for silicon (Si) devices may use another technique for depositing an SiN film such as low pressure CVD (LPCVD) because Si is unnecessary to take dissociation of elements from a surface thereof into consideration. The LPCVD may deposit an SiN film at relatively high temperature, preferably higher than 700° C. at a low pressure. Because of a high deposition temperature, an SiN film deposited thereby becomes in dense and compact with good quality.

The LPCVD technique itself has been popular in the field of the semiconductor process for Si devices; accordingly, conditions in the LPCVD technique are generally adequate for Si devices. For instance, source gases are supplied within the LPCVD apparatus with high speed to reduce unevenness in thicknesses of deposited films within a wafer and between wafers loaded in the apparatus. In order to accelerate the supply speed of the sources, the apparatus is necessary to lower a pressure within the furnace. Source gases, namely, ammonia ($NH_3$) and di-chloro-silane ($SiH_2Cl_2$) in a ratio of supply amount thereof determine whether a deposited film has designed refractive index or not. After the source gases are spread within the furnace, the LPCVD technique deposits the film after increasing the pressure to be a deposition pressure.

However, it has been known in the deposition of an SiN film by the LPCVD technique that a supplement of $NH_3$ determines the content of nitrogen (N); while a reaction between the sources determines the content of silicon (Si). Accordingly, when the LPCVD process for a nitride semiconductor material adopts the conditions confirmed in the Si process, that is, the pressure is once set lower at the beginning of the deposition, the supplement of $NH_3$ becomes insufficient, namely, excessive supplement of Si; condensed Si possibly appears within the deposited film, which degrades adhesiveness of the deposited film with the semiconductor layer and/or excess Si invades within the semiconductor layer behaving as dopants. In the Si process, the condensed Si are hard to be generated in the first place, and even when the LPCVD process causes the condensed Si, the semiconductor layer for the deposited film is Si. On the other hand, when the process for nitride semiconductor devices adopts the LPCVD technique, the condensed Si easily appears on the semiconductor layer and behaves as foreign materials in the nitride semiconductor layer.

SUMMARY OF INVENTION

An aspect of the invention relates to a process of depositing a silicon nitride (SiN) film on a nitride semiconductor layer by a low pressure chemical vapor deposition (LPCVD) technique. The process includes steps of: (1) setting a temperature in a LPCVD furnace to be higher than 750° C. but lower than 900° C.; (2) substituting an atmosphere in the LPCVD furnace to an ammonia ($NH_3$) atmosphere; (3) setting a pressure in the LPCVD furnace, to be a first pressure by flowing only ammonia ($NH_3$); (4) depositing the SiN film by supplying di-chloro-silane ($SiH_2Cl_2$) at the first pressure; and (5) subsequently depositing the SiN film by changing the pressure to a second pressure that is higher than the first pressure. A feature of the process is that the first pressure is 60% or more of the second pressure.

BRIEF DESCRIPTION OF THE DRAWINGS

The following drawings are presented by way of example only and without limitation, and wherein.

DESCRIPTION OF EMBODIMENTS

Next, some embodiments of a process of forming a silicon nitride (SiN) film and a process of forming a semiconductor device according to the present invention will be described. However, the present invention is not restricted to those embodiments, and has a scope defined in claims attached and includes all modifications and changed within claims and equivalents thereto. In the description of drawings, numerals or symbols same with or similar to each other will refer to elements same with or similar to each other without duplicating explanations.

First Embodiment

Figure 1:
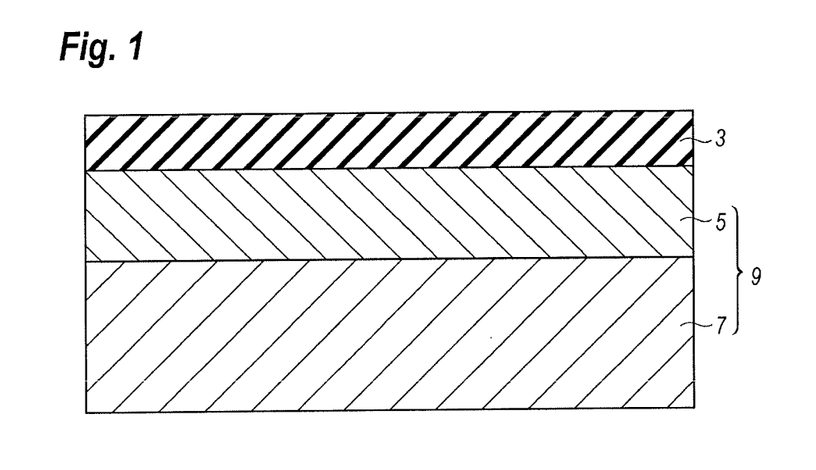
FIG. 1 is a cross sectional view of a silicon nitride (SiN) film deposited by a process according to the first embodiment of the present invention.

FIG. 1 is a cross sectional view of a silicon nitride (SiN) film formed by a process according to the first embodiment of the present invention. The SiN film 3, which is in contact with a surface of a semiconductor stack 5, is formed on the semiconductor stack by, what is called, a low pressure chemical vapor deposition technique, which is herein after called as an LPCVD. The semiconductor stack 5 includes, on a substrate 7 that may be made of, for instance, silicon carbide (SiC), nitride semiconductor layers such as, for instance, gallium nitride (GaN) epitaxially grown on the substrate 7.

Figure 2:
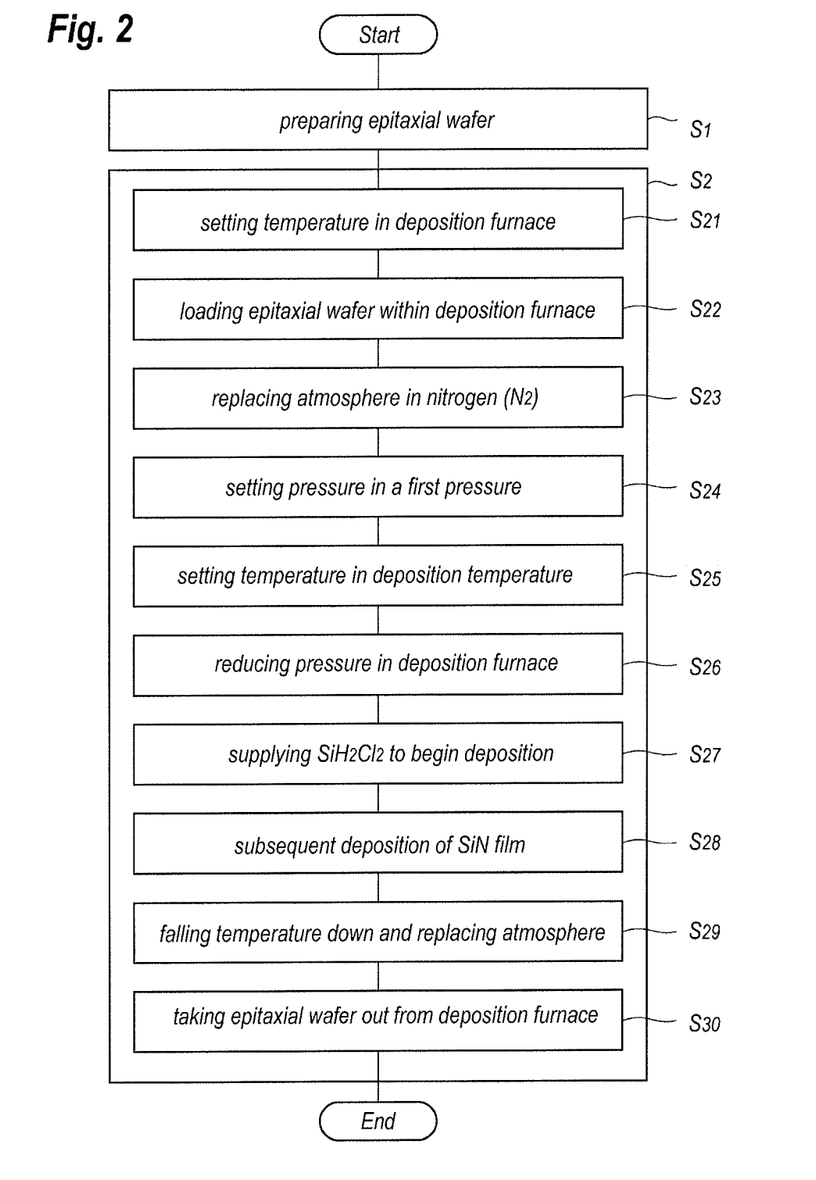
FIG. 2 shows a flow chart of the process of forming the SiN film shown in FIG. 1.

FIG. 2 shows a sequence of forming the SiN film 3 according to the first embodiment by a flow chart of the process. The sequence first grows semiconductor stack 5 on the substrate 7 by a metal organic chemical vapor deposition (MOCVD) technique to form an epitaxial wafer 9 at step $S_1$.

Thereafter, the SiN film 3 is formed on the semiconductor stack 5 by the LPCVD technique at step $S_2$. Details of the step $S_2$ are shown in FIG. 3 and FIG. 4, where FIG. 3 shows sequences of a temperature, which will be called as a furnace temperature, and a supply of source materials, while, FIG. 4 shows sequences of a pressure, which will be called as a furnace pressure, in a period A indicated in FIG. 3, and a supply of source materials.

Figure 3:
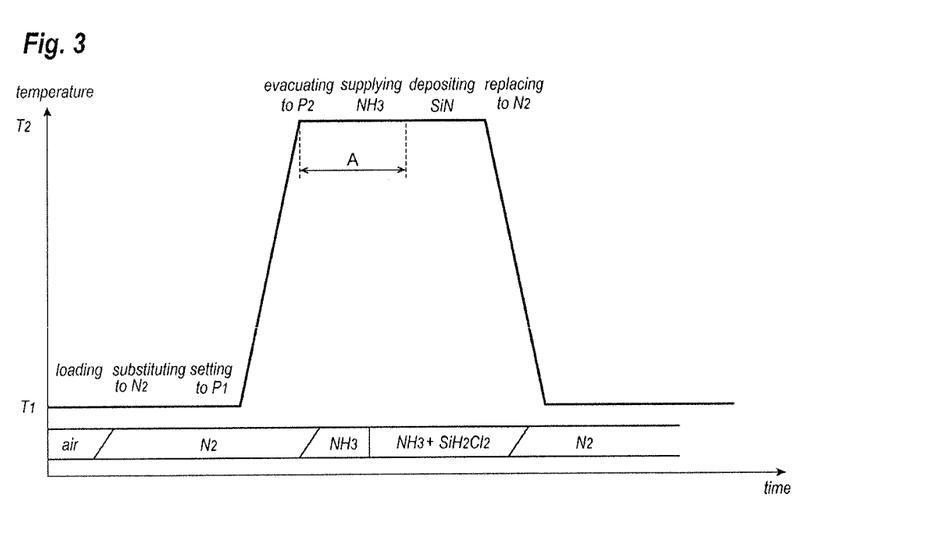
FIG. 3 shows a sequence of a temperature and a pressure in a furnace of the low pressure chemical vapor deposition (LPCVD) apparatus according to the first embodiment of the present invention.
Figure 4:
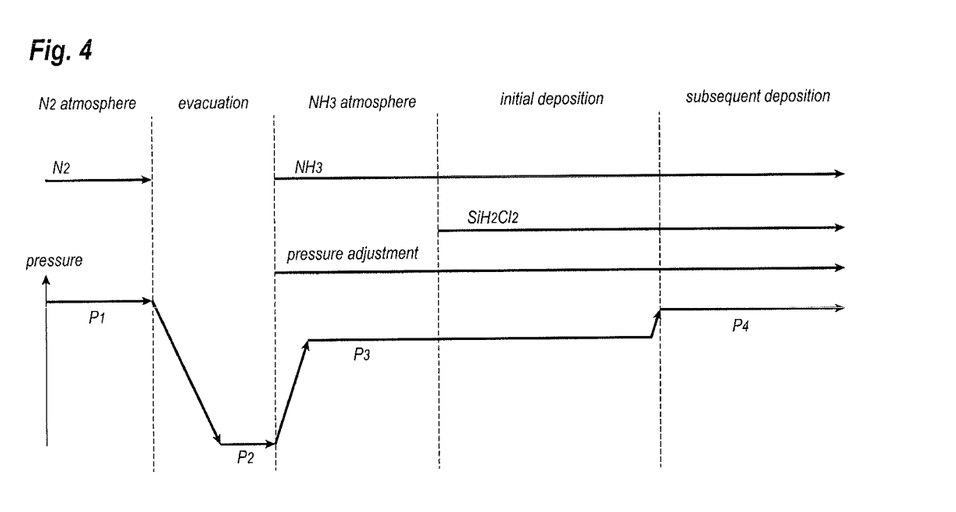
FIG. 4 shows details of the pressure and the atmosphere in the furnace of the LPCVD apparatus during a period A indicated in FIG. 3.

As shown in FIG. 3, the sequence first sets the furnace temperature to be a first temperature $T_1$ at step $S_{21}$, where the first temperature $T_1$ is lower than a practical deposition temperature, for instance, lower than 650° C. After the furnace temperature stabilizes at 650° C., the epitaxial wafer 9 including the semiconductor stack 5 is loaded within the furnace at step $S_{22}$ under atmosphere. Thereafter, the process substitutes an ambience in the furnace from air to nitrogen ($N_2$) iterating exhaustion and introduction of nitrogen (N) at step $S_{23}$.

Completing the substitution of the atmosphere to nitrogen ($N_2$), the process changes the furnace pressure to a pressure $P_1$ at step $S_{24}$, where the pressure $P_1$ is preferably higher than 3 kPa or further preferably higher than 30 kPa but lower than 100 kPa. The present embodiment sets the pressure $P_1$ to be 60 kPa. Maintaining the atmosphere within the furnace in nitrogen ($N_2$), the process raises a temperature to a deposition temperature $T_2$ at step $S_{25}$, as shown in FIG. 3. The deposition temperature $T_2$ is preferably high than 750° C. but lower than 900° C., or further preferably higher than 800° C. but lower than 850° C. The present embodiment sets the deposition temperature $T_2$ to be 830° C. A rising rate of the temperature is preferably less than 10° C./minute, where the embodiment spends 30 minutes for raising the temperature from 650° C. to 800° C. After raising the temperature, the process checks leakage of the furnace; specifically, evacuating the furnace and closing the furnace air-tightly, the system checks a change of the inner pressure of the furnace.

After the temperature becomes stable at the deposition temperature $T_2$, the sequence substitutes the atmosphere in the furnace from nitrogen ($N_2$) to ammonia ($NH_3$) at step $S_{26}$. Specifically, evacuating the furnace to a pressure $P_2$, for instance lower than one (1) Pa, where the embodiment sets the pressure after the evacuation to be 0.5 Pa; then ammonia ($NH_3$) is supplied within the furnace as raising the pressure to the deposition pressure $P_4$ or an initial pressure $P_3$ that is lower than the deposition pressure $P_4$. Thus, only one purge, or evacuation, in the furnace may substitute the atmosphere from nitrogen ($N_2$) to ammonia ($NH_3$) by evacuating the furnace lower than 1 Pa, which also shortens a period for the epitaxial wafer 9 to be exposed in a condition of a high temperature and a low pressure compared with another sequence to replace the atmosphere through iterated evacuation. A sequence to perform the evacuation and the supply of ammonia ($NH_3$) several times may securely substitute the atmosphere in the furnace from nitrogen ($N_2$) to ammonia ($NH_3$).

The deposition pressure $P_4$ is preferably 10 to 100 Pa, where the embodiment sets the deposition pressure $P_4$ to be 50 Pa, while, the initial pressure $P_3$ at which ammonia ($NH_3$) is to be supplied is higher than, for instance 6 Pa, but lower than the deposition pressure $P_4$. Specifically, the initial pressure $P_3$ is preferably higher than 60% of the deposition temperature $P_4$, or further preferably higher than 80% of the deposition temperature $P_4$.

After the pressure in the furnace is set to be the initial pressure $P_3$, the sequence supplies di-chloro-silane ($SiH_2Cl_2$) in addition to ammonia ($NH_3$) to begin the deposition of the SiN film 3 at step $S_{27}$. Supplying ratio of two sources, $SiH_2Cl_2$ and $NH_3$, may be adjusted depending on a composition of the deposited SiN film 3. Denoting the composition of the SiN film 3 as $Si_xN_y$, the ratio of the silicon against nitrogen (X/Y) is preferably ¾ or greater. That is, the deposited SiN film 3 has the composition equal to or greater than a stoichiometric composition. Also, a ratio of flow rates of di-chloro-silane against ammonia is preferably 1:10. The flow rate of di-chloro-silane ($SiH_2Cl_2$) of the present embodiment is set to be 50 sccm, while, that of ammonia ($NH_3$) is 500 sccm, where 1 sccm corresponds of a flow rate of 1 $cm^3$/min at 1 atm and 0° C.

Because the step $S_{27}$ begins the deposition as maintaining the pressure in the furnace to be the initial pressure $P_3$, the flow rate of ammonia ($NH_3$) gradually decreases as increasing the flow rate of di-chloro-silane ($SiH_2Cl_2$) to finally set the ratio of the flow rates in the above described ratio. Specifically, the sequence first sets the flow rate of ammonia ($NH_3$) to be 550 sccm just after the substitution of the atmosphere at the step $S_{26}$, then supplies di-chloro-silane ($SiH_2Cl_2$) at the flow rate of 50 sccm and decreases the flow rate of ammonia ($NH_3$) to be 500 sccm. During the sequence from the supplement of ammonia ($NH_3$) to the final set of the flow rates, the process may keep the pressure in the furnace by adjusting a valve through which gases supplied within the furnace are to be exhausted. The SiN film 3 is deposited at least 2 nm at the initial pressure $P_3$ until the sequence turns step $S_{28}$.

The sequence then at step $S_{28}$ raises the pressure in the furnace to the deposition pressure $P_4$, which is the second pressure. When the deposition pressure $P_4$ is unchanged from the initial pressure $P_3$, no additional procedures are carried out; while, when the deposition pressure $P_4$ is higher than the initial pressure $P_3$, the sequence raises the pressure in the furnace to the deposition pressure $P_4$. Flow rates of di-chloro-silane ($SiH_2Cl_2$) and ammonia ($NH_3$) at the deposition pressure $P_4$ may be equal to the respective flow rates thereof once set at the initial pressure $P_3$. The sequence deposits the SiN film 3 at the deposition pressure $P_4$ and the deposition temperature $T_2$ by a designed thickness as supplying di-chloro-silane ($SiH_2Cl_2$) and ammonia ($NH_3$) by the respective flow rates above described.

Completing the deposition of the SiN film 3, the sequence interrupts the supplement of di-chloro-silane ($SiH_2Cl_2$) to set the atmosphere in the furnace in ammonia ($NH_3$). Evacuating the furnace to a pressure lower than 1 Pa; the sequence supplies nitrogen ($N_2$) in the furnace to substitute the atmosphere thereof and falls the temperature down to, for instance, the first temperature $T_1$. The epitaxial wafer 9 may be taken out from the furnace at step $S_{30}$ after diluting the atmosphere in the furnace with nitrogen ($N_2$) until chlorine ($Cl_2$) that originates to di-chloro-silane ($SiH_2Cl_2$) becomes undetected at step $S_{29}$. Thus, the sequence to deposit the SiN film 3 on the semiconductor stack 5 is completed. The sequence above described substitutes the atmosphere to nitrogen ($N_2$) from ammonia ($NH_3$) after the temperature is fallen down, but in an alternative, the substitution to nitrogen ($N_2$) may be carried out at the deposition temperature $T_2$, then the temperature may be fallen down.

Figure 5:
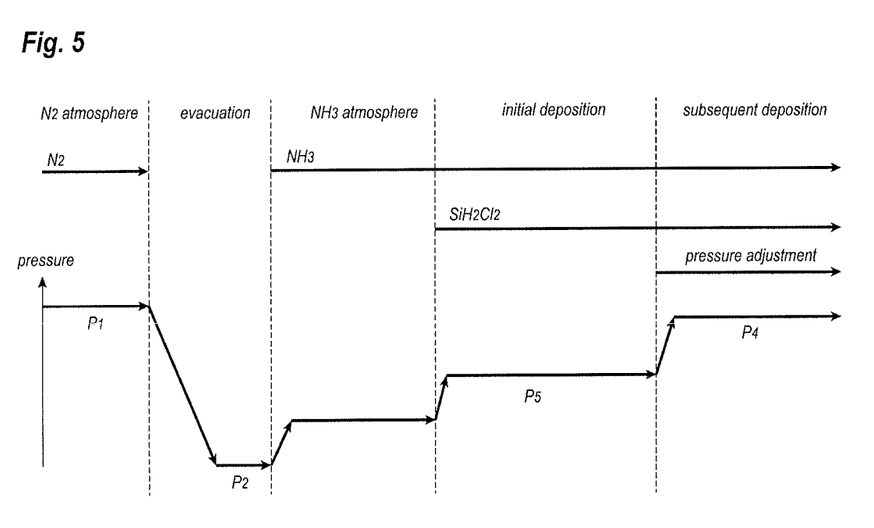
FIG. 5 shows a sequence of the pressure and the atmosphere in the furnace of the LPCVD apparatus when conditions typically used in a process of silicon devices are applied to the process for nitride semiconductor materials.

FIG. 5 shows a sequence of a pressure and an atmosphere within an LPCVD apparatus where those conditions are generally applied to a semiconductor process for devices primarily made of silicon (Si). When the LPCVD process is applied in the Si process, the pressure $P_5$ at the beginning of the deposition is set enough lower than the deposition pressure $P_4$, for instance, lower than ⅕ of the deposition pressure $P_4$, which may accelerate flow speed of source gasses and enhance homogeneity of the source gases within the LPCVD apparatus to reduce dispersion in thicknesses of SiN films deposited on respective substrates loaded within the apparatus. After the homogeneity of the source gases within the apparatus is confirmed, the sequence raises the pressure to the deposition pressure $P_4$.

Figure 6A:
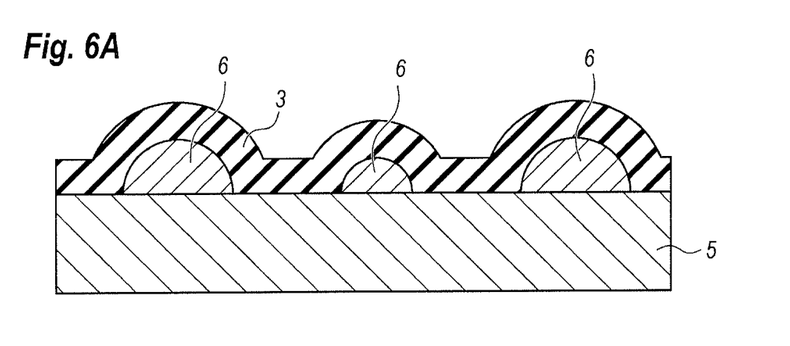
FIG. 6A schematically shows a status where Si clusters, or condensed Si, appear in an interface between a nitride semiconductor layer and the deposited SiN film, while, FIG. 6B schematically shows a status where an interface between Si substrate and the deposited SiN film becomes substantially free from Si clusters.
Figure 6B:
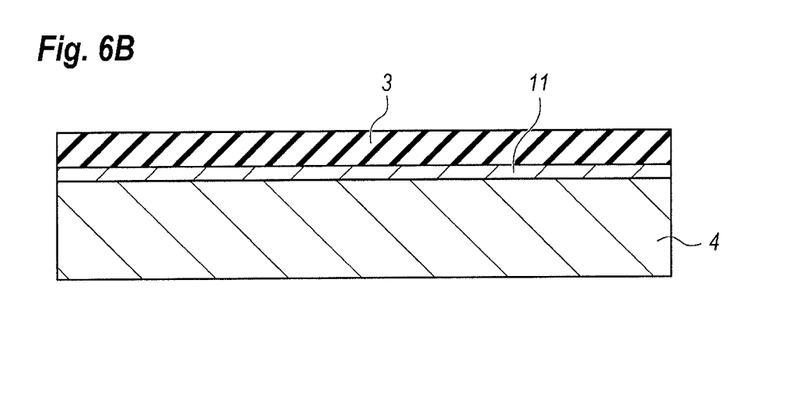
Figure 7A:
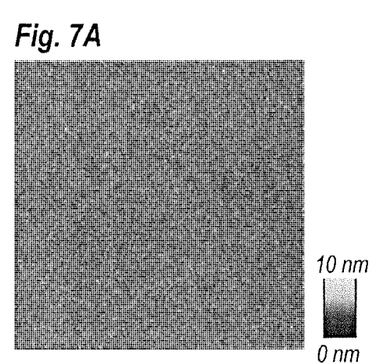
FIG. 7A to FIG. 7F show photographs of surfaces of SiN films deposited by respective ratios of the initial pressure $P_3$ against the deposition pressure $P_4$, where the photographs are taken by an atomic force microscope (AFM)
Figure 7B:
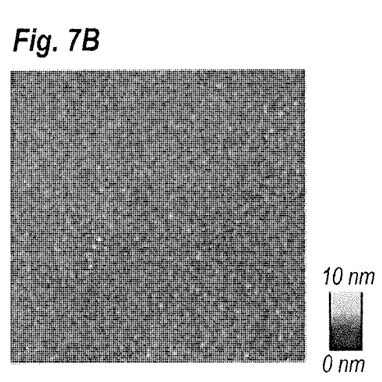
Figure 7C:
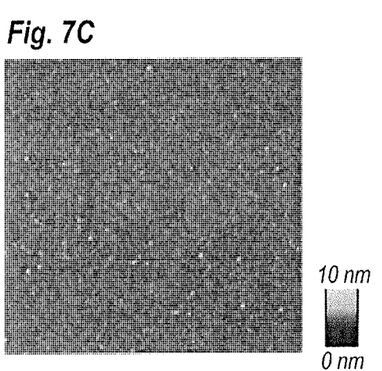
Figure 7D:
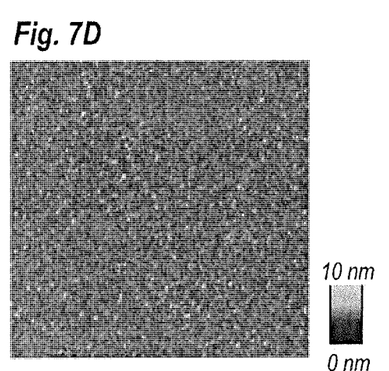
Figure 7E:
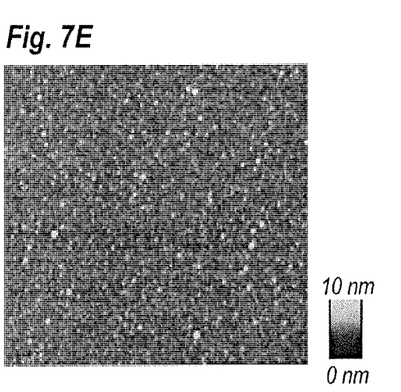
Figure 7F:
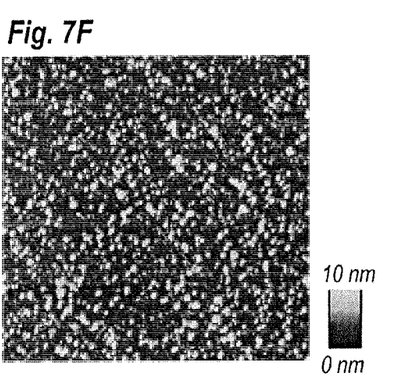

However, in the deposition of a SiN film by the CVD technique, the deposition rate of the film depends on the supply rate of the source for nitrogen (N), while, on the reaction speed for silicon (Si). Accordingly, the sequence shown in FIG. 5 lacks nitrogen (N) in the beginning of the deposition, which means that the deposited SiN film becomes a Si-rich composition and possibly causes Si clusters 6 between the nitride semiconductor layer 5 and the SiN film 3 as shown in FIG. 6A. Such Si clusters 6 not only reduces the adhesiveness of the SiN film 3 with the nitride semiconductor layer 5 but also behaves as n-type dopants invading into the nitride semiconductor layer 5. When the LPCVD process deposits an SiN film on a Si substrate 3 as shown in FIG. 6B, Si clusters 6 are scarcely caused on the surface of the Si substrate 3. Even when the Si clusters 6 appears on the surface, the Si clusters 6 do not behave as dopants for the Si substrate. Contrary to the Si process, when the LPCVD process deposits the SiN film 6 on the nitride semiconductor layer 3, the Si clusters 6 become fatal defects.

The process according to the embodiment sets the initial pressure $P_3$ at the beginning of the deposition that is at least 60% of the deposition pressure $P_4$. Table below summarizes surface roughness of SiN films in a unit of root-mean-square (RMS) where the SiN films are deposited by various initial pressures $P_3$. Those conditions in the table are carried out by sequences, after the substituting step $S_{26}$, first setting the initial pressures $P_3$ at those below listed as keeping the flow rate of ammonia ($NH_3$) to be 550 sccm; then, depositing an SiN film 3 with a thickness about 2 nm by changing the flow rate of ammonia ($NH_3$) to 500 sccm and supplying di-chloro-silane ($SiH_2Cl_2$) with the flow rate of 50 sccm, and finally depositing a rest portion of the SiN film 3 with a thickness of 100 nm by changing the pressure $P_4$ to 50 Pa, or 25 Pa, which is the deposition pressure $P_4$, as maintaining the flow rates of the source gases, namely ammonia ($NH_3$) and di-chloro-silane ($SiH_2Cl_2$). The conditions in table below correspond to those that the deposited SiN film 3 has refractive index of 2.4.

TABLE (deposition pressure $P_4$ = 50 Pa)

| | conditions | | | | | |
|---|---|---|---|---|---|---|
| | 1 | 2 | 3 | 4 | 5 | 6 |
| initial pressure $P_3$ (Pa) | 50 | 40 | 30 | 20 | 10 | 5 |
| surface roughness (nm) | 0.61 | 0.69 | 0.79 | 1.05 | 1.51 | 2.52 |

(continued, deposition pressure $P_4$ = 25 Pa)

| | conditions | | | | | |
|---|---|---|---|---|---|---|
| | 7 | 8 | 9 | 10 | 11 | 12 |
| initial pressure $P_3$ (Pa) | 25 | 20 | 15 | 10 | 5 | 2.5 |
| surface roughness (nm) | 0.57 | 0.65 | 0.74 | 0.90 | 1.42 | 2.45 |

Figure 8:
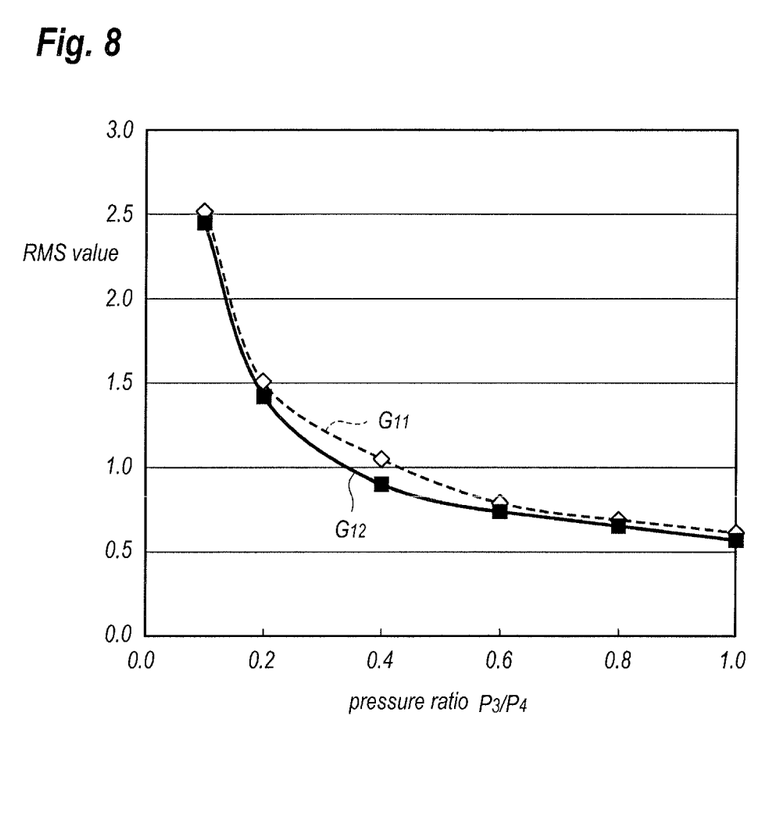
FIG. 8 shows behaviors of the surface roughness of the SiN film in the unit of root mean square (RMS) changing the ratio of the initial pressure $P_3$ against the deposition pressure $P_4$.

FIG. 7A to FIG. 7F are photographs showing surfaces of SiN films 3 deposited by the conditions 1 to 6 in table above; that is, the conditions for the deposition pressure $P_4$ of 50 Pa, where the photographs are taken by the technique of the atomic force microscope (AFM) within an area of 3 μm square. In those photographs, darker regions correspond to the RMS value of 0 nm, while, lighter regions correspond to the RMS value of 10 nm. FIG. 8 shows behaviors of the RMS values in the vertical axis against the ratio of the initial pressure $P_3$ against the deposition pressure $P_4$ in the horizontal axis. A behavior symbolled by $G_{11}$ corresponds to the conditions 1 to 6, namely, the deposition pressure $P_4$ of 50 Pa; while, another behavior $G_{12}$ corresponds to the deposition pressure $P_4$ to 25 Pa.

Referring to FIG. 7A to FIG. 7F and FIG. 8, the surface roughness (RMS) becomes smaller as the initial pressure $P_3$ approaches the deposition pressure $P_4$, that is, the surface roughness of the SiN film 3 becomes smallest when the initial pressure $P_3$ is equal to the deposition pressure $P_4$. When the pressure ratio, $P_3/P_4$, is at least 0.6; the surface roughness of the SiN film 3 in the unit of RMS clearly reduces compared with those for the pressure ratios smaller than 0.6, for instance 0.1 and 0.2. The improvement in the surface roughness saturates when the ratios $P_3/P_4$ becomes greater than 0.6. A pressure ratio, $P_3/P_4$, smaller than 0.2, which is a typical condition in a process for Si devices, the surface of the deposited SiN film 3 is clearly degraded. Because such degradation in the surface roughness seems to be due to formation of the Si clusters 6 on the nitride semiconductor layer 5, the condition that the initial pressure $P_3$ is at least greater than 60% of the deposition pressure $P_4$ may effectively reduce the formation of the Si clusters 6 between the SiN film 3 and the nitride semiconductor layer 5.

As described, the initial pressure $P_3$ may be equal to the deposition pressure $P_4$, which may clearly improve the surface roughness of the SiN film 3. The sequence of the present embodiment may deposit the SiN film 3 by at least 2 nm at the initial pressure $P_3$, which means that the sequence may start the deposition of the SiN film 3 at the deposition pressure $P_4$ after securely reducing the formation of the Si clusters 6 at the initial pressure $P_3$.

The sequence of the embodiment substitutes the atmosphere from air to nitrogen ($N_2$) at the step $S_{21}$ where the temperature in the furnace is set at the first temperature $T_1$. Because the substitution to nitrogen ($N_2$) is carried out at the temperature $T_1$, the raise of the temperature may be safely carried out. When the raise of the temperature is done under a condition where the furnace is substituted in the atmosphere of ammonia ($NH_3$), the LPCVD apparatus is necessary to be severely controlled in leakage of ammonia ($NH_3$).

The sequence of the embodiment increases the supply of di-chloro-silane ($SiH_2Cl_2$) concurrently with decreasing the supply of ammonia ($NH_3$), which may stabilize the pressure within the furnace and also enhance quality of deposited SiN film 3. In an alternative, the supplies of di-chloro-silane ($SiH_2Cl_2$) and ammonia ($NH_3$) at the deposition pressure $P_4$ may be equal to the supplies of those sources at the initial pressure $P_3$. Such sequence may stabilize the supply of the sources from the step $S_{27}$ to the step $S_{28}$ and enhance the quality of deposited SiN film 3.

The sequence according to the embodiment may deposit the SiN film 3 with a Si rich composition. That is, denoting the SiN film 3 in the composition thereof to be $Si_xN_y$, the ratio X/Y may be greater than ¾, which is a Si-rich condition compared with the stoichiometric composition of SiN. In order to deposit such a Si-rich SiN film, the sequence according to the present embodiment may be further effective because the sequence may effectively suppress the formation of the Si clusters 6.

When the pressure ratio $P_3/P_4$ becomes further greater, the SiN film 3 likely shows inhomogeneity in a thickness thereof between the substrates and within the substrate. Accordingly, when the pressure ratio $P_3/P_4$ is set greater, other techniques will be necessary to secure the homogeneity in the thickness of the deposited film, such as, reducing a count of the substrate to be loaded within the furnace, and so on.

Second Embodiment

Next, a process of forming a semiconductor device will be described referring to FIG. 9A to FIG. 11B, where the semiconductor device has a type of HEMT primarily made of nitride semiconductor materials and provides the SiN film 3 deposited by the sequence above described. FIG. 9A to FIG. 11B are cross sectional views of the semiconductor device at respective steps of the process of forming the device. The embodiment concentrates on a device type of GaN-HEMT.

Figure 9A:
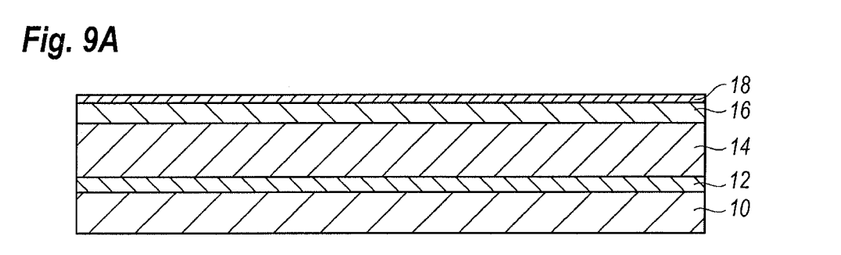
FIG. 9A to FIG. 9C are cross sectional views of the HEMT at respective steps of the process according to the second embodiment of the present invention.

First, as shown in FIG. 9A, the process forms a semiconductor stack 20 on a substrate 10 by epitaxially growing semiconductor layers by the MOCVD technique. The substrate 10 may be a silicon carbide (SiC) with a primary surface of (0001) crystal plane on which the semiconductor layers are epitaxially grown along [0001] crystallographic axis. The semiconductor stack 20 includes a nucleus forming layer 12, a carrier travelling layer 14, a carrier supplying layer 16, and a cap layer 18. The nucleus forming layer 12 is made of aluminum nitride (AlN) with a thickness of several scores of nano-meters. The carrier travelling layer 14 is made of gallium nitride (GaN) with a thickness of 1 μm. The carrier supplying layer 16 is made of n-type aluminum gallium nitride (n-AlGaN) with a thickness of 20 nm. The cap layer 18 is also made of n-type GaN with a thickness of 5 nm. In an alternative, the HEMT may omit the cap layer 18.

Figure 9B:
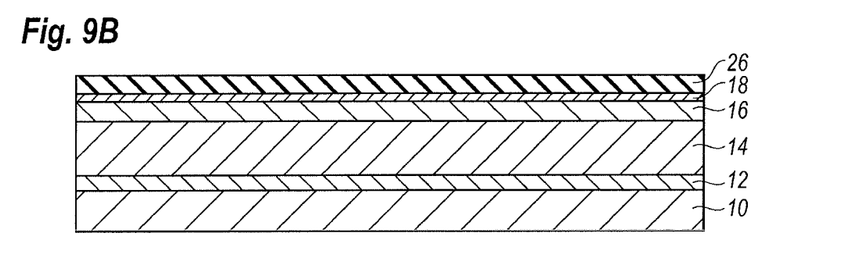

Thereafter, as shown in FIG. 9B, the process deposits the SiN film 26 on the semiconductor stack 20 by the LPCVD technique. The LPCVD technique adopts the sequence described in the first embodiment, where the deposition temperature $T_2$ is set to be 800° C. and the sources are ammonia ($NH_3$) and di-chloro-silane ($SiH_2Cl_2$) for nitrogen (N) and silicon (Si), respectively. The SiN film 26 has a thickness of, for instance, 100 nm where the step $S_{27}$ at the initial pressure $P_3$ deposits the SiN film 26 by 2 nm, while, the step $S_{28}$ at the deposition pressure $P_4$ deposits a rest portion of the SiN film 26.

Figure 9C:
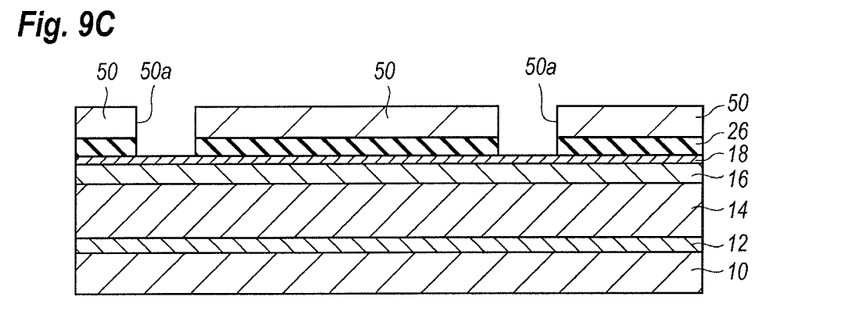

Thereafter, as shown in FIG. 9C, a patterned photoresist 50 with openings 50a covers the SiN film 26. A reactive ion etching (RIE) using a reactive gas containing fluorine (F) may form openings in the SiN film 26. The photoresist 50 is removed after the formation of the opening.

Figure 10A:
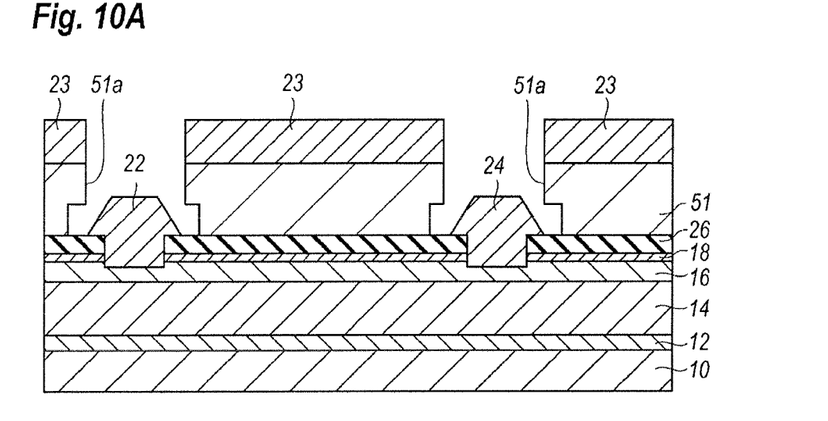
FIG. 10A and FIG. 10B are cross sectional views of the HEMT at respective steps of the process subsequent to the step shown in FIG. 9C.

Thereafter, as shown in FIG. 10A, another patterned photoresist 51 covers the SiN film 26, where the patterned photoresist 51 provides openings 51a each overlapping with the openings in the SiN film 26. The openings 51a in the patterned photoresist 51 are wider than the openings 50a in the former patterned photoresist 50. That is, the openings 51a in the second photoresist 51 fully expose the openings in the SiN film 26, where the openings in the SiN film 26 each expose the surface of the cap layer 18. Then, the reactive ion etching (RIE) using a reactive gas containing chlorine (Cl) removes the cap layer 18 and a portion of the carrier supplying layer 16 exposed within the openings in the SiN film 26.

Thereafter, the electrodes of the source 22 and the drain 24 are formed so as to be in contact with the carrier supplying layer 16 through the openings in the SiN film 26. Specifically, for instance, metal evaporation stacks titanium (Ti) and aluminum (Al) within the openings 51a in the second photoresist 51, where those metals of Ti and Al have thicknesses of 30 and 300 nm, respectively. Tantalum (Ta) may substitute for Ti. Also, the metal stacks of Ti/Al may provide another Ti on Al, where the additional Ti has a thickness substantially same with the former Ti, that is, 300 nm. After the deposition of the stacked metals, the second photoresist 51 may be removed accompanying with residual metals accumulated on the second photoresist 51, which is called the metal lift-off technique. Then, alloying the stacked metals at a temperature of, for instance, 500 to 600° C., the electrodes of the source 22 and the drain 24 may show un-rectified performance. Alloying temperature higher than 550° C. may reduce contact resistance against the carrier supplying layer 16. As shown in FIG. 10A, the electrodes of the source 22 and the drain 24 partially overlap with the SiN film 26. Because the SiN film 26 of the present embodiment is formed by the LPCVD technique at a relatively higher temperature, which may form the SiN film 26 in tight and dense. Accordingly, the stacked metals are hard to be mixed with the SiN film 26 even when the stacked metals are alloyed at a temperature higher than 500° C.

Figure 10B:
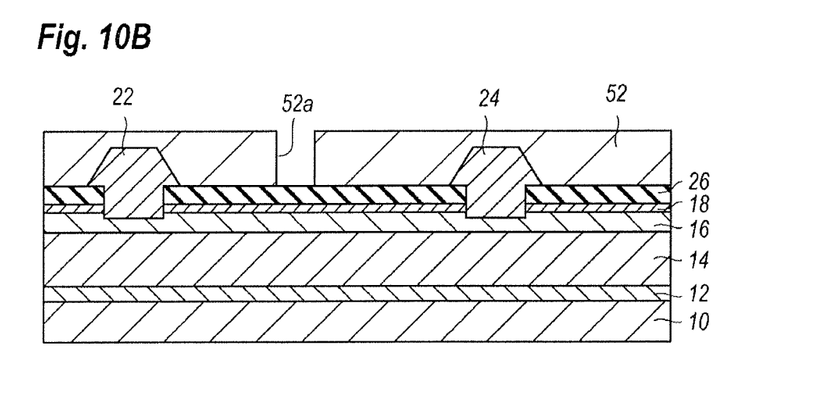

Thereafter, as shown in FIG. 10B, still another photoresist 52 covers the electrodes of the source 22 and the drain 24, and the SiN film 26, where the third photoresist 52 has an opening 52a between the electrodes of the source 22 and the drain 24. The RIE using a reactive gas containing fluorine (F) may form an opening in the SiN film 26. After the RIE process, the third photoresist 52 are removed.

Figure 11A:
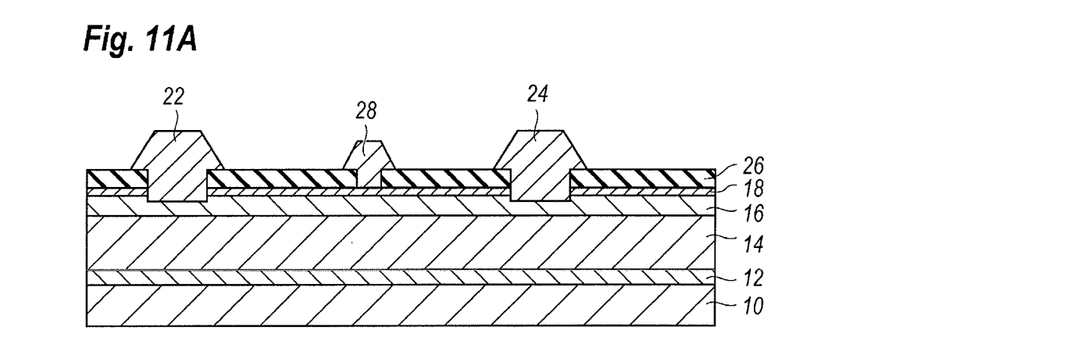
FIG. 11A and FIG. 11B are cross sectional views of the HEMT at respective steps of the process subsequent to the step shown in FIG. 10B.

Thereafter, still another patterned photoresist covers the SiN film 26 and the electrodes of the source 22 and the drain 24, where the patterned photoresist provides an opening that fully exposes the opening in the SiN film 26, as shown in FIG. 11A. The metal evaporation of nickel (Ni) and gold (Au) with thicknesses of 50 and 400 nm, respectively, may form the gate electrode 28, where Ni is in contact with the semiconductor stack 20, namely, the cap layer 18. Residual metals accumulated on the patterned photoresist are also removed concurrently with a process of solving the patterned photoresist by the lift-off technique.

Figure 11B:
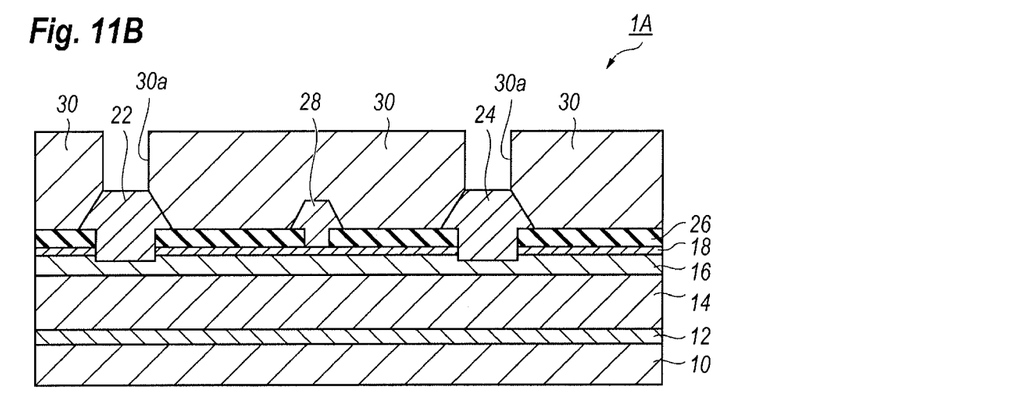

Thereafter, as shown in FIG. 11B, an insulating film 30 covers the electrodes of the source 22, the drain 24, and the gate 28 and the SiN film 26, where the insulating film 30 with a thickness around 500 nm may be also SiN formed by plasma-assisted chemical vapor deposition (p-CVD) technique. Because the deposition is assisted by plasma, that is sources for silicon (Si) and nitrogen (N) are accelerated by plasma in dissociation thereof from mono-silane ($SiH_4$) and ammonia ($NH_3$), the deposition may be done at relatively lower temperature, for instance, around 300° C. The RIE using a reactive gas containing fluorine (F) may form openings 30a on the electrodes of the source 22 and the drain 24, and interconnections for those electrodes, 22 and 24, are formed so as to be in contact with the electrodes, 22 and 24, through the opening 30a. Thus, the process of forming the HEMT 1A according to the present embodiment is completed.

Because the first SiN film 26 in direct contact with the semiconductor stack 20 is formed by the LPCVD technique with the sequence of the first embodiment, the sequence may reduce the Si clusters appearing between the semiconductor stack 20 and the SiN film 26, which may enhance the reliability of the HEMT 1A and suppress the degradation in performance of the HEMT 1A.

Figure 12:
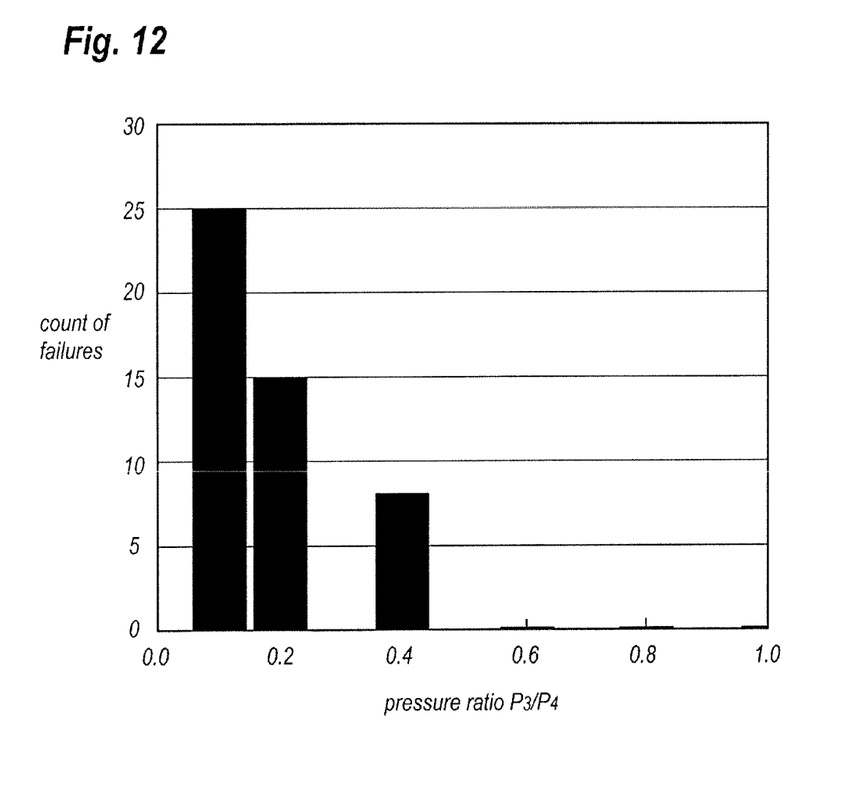
FIG. 12 show the histogram of the failures as varying the ratio of the initial pressure $P_3$ against the deposition pressure $P_4$ for the SiN film, where the failures are evaluated through the leakage current between the source electrode and the gate electrode at a reversed bias of 40 V.

FIG. 12 shows a histogram of failures against the ratio of the initial pressure $P_3$ against the deposition pressure $P_4$ for a hundred of HEMTs 1A, where failures are evaluated through a leak current flowing between the gate electrode 28 and the source electrode 22 at reversely biased of 40 V, while, the drain electrode 24 is opened. The SiN film 26 is deposited by the sequence of first setting the pressure in the furnace to be the initial pressure $P_3$ supplying only ammonia ($NH_3$) with the flow rate of 550 sccm after the substitution to ammonia ($NH_3$) atmosphere; then, depositing the SiN film 26 by about 2 nm by supplying di-chloro-silane ($SiH_2Cl_2$) with the flow rate of 50 sccm and reducing the flow rate of ammonia ($NH_3$) down to 500 sccm; and finally changing the pressure to the deposition pressure $P_4$, which is 50 Pa, as keeping the flow rates of di-chloro-silane ($SiH_2Cl_2$) and ammonia ($NH_3$). The HEMT thus formed has dimensions of a source-drain distance $L_{SD}$ of 7.2 m, a source-gate distance $L_{SG}$ of 1.4 µm, a gate length $L_G$ of 0.6 m, and a gate width $W_G$ of 25 mm.

Referring to FIG. 13, the count of the failures decreases as the initial pressure $P_3$ approaches the deposition pressure $P_4$, that is $P_3/P_4$ approaches unity (1). In particular, substantially no failures may be obtained at the pressure ratio $P_3/P_4$ greater than 0.6. When the pressure ratio becomes smaller than 0.2, which is a typical sequence of the LPCVD technique for the process of Si devices, the failures drastically increase, which may reflect the results in the surface roughness of the deposited SiN film 26.

It is understood that the examples and embodiments described above are for illustrative purposes only and that various modifications or changes in light thereof will be suggested to persons skilled in the art and are to be included within the spirit and purview of this application and scope of the appended claims.

What is claimed is:

1. A process of depositing a silicon nitride (SiN) film on a nitride semiconductor layer by a low pressure chemical vapor deposition (LPCVD) technique, the process comprising steps of:
   setting a temperature in a LPCVD furnace to be higher than 750° C. but lower than 900° C.;
   substituting an atmosphere in the LPCVD furnace to an ammonia $NH_3$ atmosphere;
   setting a pressure in the LPCVD furnace to be a first pressure by flowing only ammonia ($NH_3$);
   depositing the SiN film by supplying di-chloro-silane ($SiH_2Cl_2$) at the first pressure; and
   subsequently depositing the SiN film by changing the pressure to a second pressure that is higher than the first pressure,
   wherein the first pressure is 60% or more of the second pressure.

2. The process according to claim 1,
   wherein the first pressure is lower than the second pressure.

3. The process according to claim 1,
   wherein the step of depositing the SiN film at the first pressure deposits the SiN film by at least 2 nm.

4. The process according to claim 1,
   wherein the step of setting the temperature is carried out at a nitrogen ($N_2$) atmosphere in the LPCVD furnace.

5. The process according to claim 1,
   wherein the step of substituting the atmosphere to the ammonia atmosphere includes steps of:

evacuating the LPCVD furnace to a pressure lower than 1 Pa, and supplying ammonia (NH$_3$) within the LPCVD furnace.

6. The process according to claim 1, wherein the step of depositing the SiN film includes a step of maintaining the pressure in the LPCVD furnace to be the first pressure while increasing the supply of di-chloro-silane (SiH$_2$Cl$_2$) concurrently with a decrease of ammonia (NH$_3$).

7. The process according to claim 1, wherein the step of subsequently depositing the SiN film maintains the supply of ammonia (NH$_3$) and di-chloro-silane (SiH$_2$Cl$_2$) substantially equal to the supply of NH$_3$ and SiH$_2$Cl$_2$ at an end of the step of depositing the SiN film.

8. The process according to claim 1, wherein the SiN film has a composition ratio of silicon (Si) against nitrogen (N) equal to or greater than 3/4.

9. A process of forming a nitride semiconductor device comprising steps of:

forming a semiconductor stack on a substrate, the semiconductor stack including nitride semiconductor layers;

forming a passivation film made of silicon nitride (SiN) on the semiconductor stack by a low pressure chemical vapor deposition (LPCVD) technique;

forming electrodes of a source and a drain on the semiconductor stack by forming respective openings in the passivation film; and forming an electrode of a gate on the semiconductor stack by forming an opening in the passivation film, wherein the step of forming the passivation film includes steps of:

setting a temperature in a LPCVD furnace to be higher than 750° C. but lower than 900° C.;

substituting an atmosphere in the LPCVD furnace to an ammonia (NH$_3$) atmosphere;

setting a pressure in the LPCVD furnace to be a first pressure by flowing only ammonia (NH$_3$);

depositing the SiN film by supplying di-chloro-silane (SiH$_2$Cl$_2$) at the first pressure; and subsequently depositing the SiN film by changing the pressure in a second pressure that is higher than the first pressure, wherein the first pressure is 60% or higher of the second pressure.

10. The process according to claim 9, wherein the first pressure is lower of the second pressure.

11. The process according to claim 9, wherein the step of depositing the SiN film at the first pressure deposits the SiN film by at least 2 nm.

12. The process according to claim 9, wherein the step of setting the temperature is carried out at a nitrogen (N$_2$) atmosphere in the LPCVD furnace.

13. The process according to claim 9, wherein the step of substituting the atmosphere to the ammonia atmosphere includes steps of:

evacuating the LPCVD furnace to a pressure lower than 1 Pa, and supplying ammonia (NH$_3$) within the LPCVD furnace.

14. The process according to claim 9, wherein the step of depositing the SiN film includes a step of maintaining the pressure in the LPCVD furnace to be the first pressure while increasing the supply of di-chloro-silane (SiH$_2$Cl$_2$) concurrently with a decrease of ammonia (NH$_3$).

15. The process according to claim 9, wherein the step of subsequently depositing the SiN film maintains the supply of ammonia (NH$_3$) and di-chloro-silane (SiH$_2$Cl$_2$) substantially equal to the supply of NH$_3$ and SiH$_2$Cl$_2$ at an end of the step of depositing the SiN film.

16. The process according to claim 9, wherein the SiN film has a composition ratio of silicon (Si) against nitrogen (N) equal to or greater than 3/4.

\* \* \* \* \*